(12) United States Patent
Lin

(10) Patent No.: US 12,382,630 B2
(45) Date of Patent: Aug. 5, 2025

(54) SEMICONDUCTOR ASSEMBLIES INCLUDING COMBINATION MEMORY AND METHODS OF MANUFACTURING THE SAME

(71) Applicant: Micron Technology, Inc., Boise, ID (US)

(72) Inventor: Jing Cheng Lin, Taichung (TW)

(73) Assignee: Micron Technology, Inc., Boise, ID (US)

(*) Notice: Subject to any disclaimer, the term of this patent is extended or adjusted under 35 U.S.C. 154(b) by 168 days.

(21) Appl. No.: 18/123,876

(22) Filed: Mar. 20, 2023

(65) Prior Publication Data

US 2023/0232622 A1 Jul. 20, 2023

Related U.S. Application Data

(63) Continuation of application No. 17/124,072, filed on Dec. 16, 2020, now Pat. No. 11,610,911.

(60) Provisional application No. 62/958,159, filed on Jan. 7, 2020.

(51) Int. Cl.
| | |
|---|---|
| *H01L 41/27* | (2013.01) |
| *G11C 14/00* | (2006.01) |
| *H01L 21/50* | (2006.01) |
| *H01L 23/14* | (2006.01) |
| *H01L 23/538* | (2006.01) |
| *H01L 25/065* | (2023.01) |
| *H10B 12/00* | (2023.01) |
| *H10B 41/27* | (2023.01) |
| *H10B 43/27* | (2023.01) |

(52) U.S. Cl.
CPC ......... *H10B 41/27* (2023.02); *G11C 14/0018* (2013.01); *H01L 21/50* (2013.01); *H01L 23/14* (2013.01); *H01L 23/5384* (2013.01); *H01L 23/5386* (2013.01); *H01L 25/0657* (2013.01); *H10B 12/30* (2023.02); *H10B 43/27* (2023.02)

(58) Field of Classification Search
CPC ...... H10B 41/27; G11C 14/0018; H01L 21/50
See application file for complete search history.

(56) References Cited

U.S. PATENT DOCUMENTS

| | | | |
|---|---|---|---|
| 10,153,221 B1 * | 12/2018 | Yoo | H01L 23/481 |
| 11,043,472 B1 * | 6/2021 | Dokania | H01L 23/49894 |
| 11,139,270 B2 * | 10/2021 | Manipatruni | H01L 25/50 |

(Continued)

FOREIGN PATENT DOCUMENTS

| | | |
|---|---|---|
| CN | 104392741 A | 3/2015 |
| CN | 106463469 A | 2/2017 |

OTHER PUBLICATIONS

CN Patent Application No. 202110019992.2—Chinese Office Action and Search Report, dated Aug. 14, 2024, with English Translation, 9 pages.

*Primary Examiner* — Thao P Le
(74) *Attorney, Agent, or Firm* — Dorsey & Whitney LLP

(57) ABSTRACT

Semiconductor devices including vertically-stacked combination memory devices and associated systems and methods are disclosed herein. The vertically-stacked combination memory devices include at least one volatile memory die and at least one non-volatile memory die stacked on top of each other. The corresponding stack may be attached to a controller die that is configured to provide interface for the attached volatile and non-volatile memory dies.

20 Claims, 5 Drawing Sheets

(56) References Cited

U.S. PATENT DOCUMENTS

| | | | |
|---|---|---|---|
| 11,222,884 B2* | 1/2022 | Chang | H10D 89/10 |
| 12,079,475 B1* | 9/2024 | Mathuriya | G11C 11/4093 |
| 2009/0065948 A1 | 3/2009 | Wang | |
| 2015/0160701 A1* | 6/2015 | Bruno | H01L 23/5389 |
| | | | 361/679.31 |
| 2016/0315071 A1 | 10/2016 | Zhai et al. | |
| 2018/0366429 A1 | 12/2018 | Chiu et al. | |
| 2020/0050565 A1* | 2/2020 | Zhang | H04L 63/1466 |
| 2020/0135697 A1 | 4/2020 | Brewer | |
| 2020/0135719 A1 | 4/2020 | Brewer | |
| 2020/0192791 A1* | 6/2020 | Yang | H04L 1/203 |
| 2021/0210500 A1* | 7/2021 | Lin | G11C 11/401 |
| 2021/0248094 A1 | 8/2021 | Norman et al. | |
| 2023/0368846 A1* | 11/2023 | Guo | G11C 16/3459 |
| 2024/0021249 A1* | 1/2024 | Gajula | G11C 16/102 |
| 2024/0185905 A1* | 6/2024 | Liu | G11C 11/4072 |
| 2024/0305452 A1* | 9/2024 | Wright | H04L 9/3278 |

* cited by examiner

SEMICONDUCTOR ASSEMBLIES INCLUDING COMBINATION MEMORY AND METHODS OF MANUFACTURING THE SAME

CROSS-REFERENCE TO RELATED APPLICATIONS

This application is a continuation of U.S. application Ser. No. 17/124,072, filed Dec. 16, 2020; which claims the benefit of U.S. Provisional Application No. 62/958,159, filed Jan. 7, 2020; which is incorporated herein by reference in its entirety.

TECHNICAL FIELD

The present technology is directed to packaging semiconductor assemblies, such as memory and processors, and several embodiments are directed to semiconductor assemblies that include vertically integrated circuits.

BACKGROUND

The current trend in semiconductor fabrication is to manufacture smaller and faster devices with a higher density of components for computers, cell phones, pagers, personal digital assistants, and many other products. Since semiconductor devices/components are typically arranged along a lateral plane (e.g., on a circuit board), increasing the density becomes crucial in providing increased capacity and/or functions for the corresponding products (e.g., computers, cell phones, etc.).

DETAILED DESCRIPTION

Figure 1A:
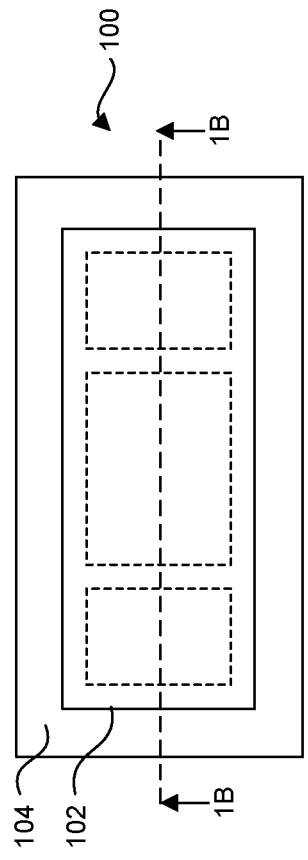
FIG. 1A is a top view of a semiconductor device assembly in accordance with embodiments of the technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include a vertically-stacked combination memory device ("combination memory device"). The combination memory device includes at least one persistent memory die (e.g., one or more NAND dies) and at least one volatile memory die (e.g., one or more dynamic random-access memory (DRAM) dies) vertically stacked on top of each other. For example, the combination memory device may include one or more NAND dies stacked on/over one or more DRAM dies. The die stack including the NAND and DRAM dies may be attached to a controller (e.g., a logic die and/or a substrate). The NAND and/or the DRAM dies may include and/or be electrically coupled to through-silicon-vias (TSVs). The TSVs can be used to communicate information (e.g., commands and/or data) between the dies, such as between the controller, the NAND dies, and/or the DRAM dies. Accordingly, the TSVs may form a vertical electrical connection that extends between the controller and one or more of the DRAM dies, between the controller and one or more of the NAND dies, and/or between one or more of the DRAM dies and one or more of the NAND dies.

In some embodiments, one or more dimensions of the NAND dies can match corresponding dimensions of the DRAM dies. For example, the die stack including the NAND and DRAM dies can have a rectilinear three-dimensional shape. Additionally, one or more dimensions of the controller may match corresponding dimensions of the die stack. In other embodiments, the controller may laterally extend beyond one or more peripheral edges of the NAND dies and/or the DRAM dies. In one or more embodiments, the DRAM dies may comprise a High-Bandwidth Memory (HBM) device that includes three-dimensionally (3D) stacked volatile memory devices (e.g., synchronous DRM (SDRAM) dies).

The combination memory device may be used in various applications. For example, a semiconductor package/assembly may include the combination device along with other logic devices (e.g., logic devices or processors, such as application processors) and/or other memory devices (e.g., HBMs). In some embodiments, the combination device may be attached laterally adjacent to one or more other devices on a package substrate. The combination device may have a height that matches height of the other devices on the package substrate. In some embodiments, the corresponding package may be attached to an assembly substrate or a system substrate along with other devices or components. Details regarding the combination device and applications thereof are described below.

Figure 1B:
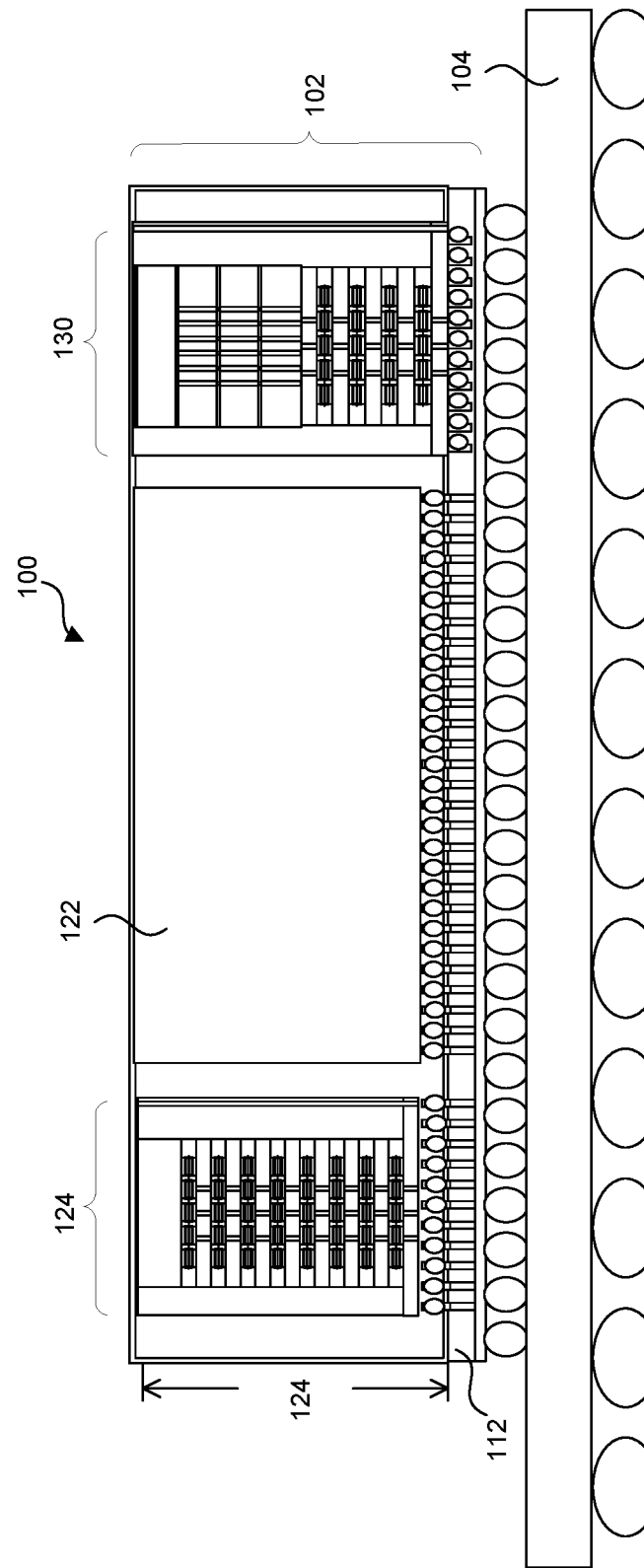
FIG. 1B is a schematic cross-sectional view of the semiconductor device assembly taken along a line 1B-1B of FIG. 1A in accordance with embodiments of the technology.

FIG. 1A is a top view of a semiconductor device assembly 100 ("assembly 100"), and FIG. 1B is a schematic cross-sectional view of the assembly 100 taken along a line 1B-1B of FIG. 1A in accordance with embodiments of the technology. Referring to FIG. 1A and FIG. 1B together, the assembly 100 can include a semiconductor package 102 ("package 102") on an assembly substrate 104 (e.g., a printed circuit board (PCB) substrate). The package 102 may be attached to the assembly substrate 104 via an electrical and/or a mechanical connector, such as solder, fused metal, adhesive, wires (e.g., bond wires), etc. The electrical connector may also electrically couple the package 102 to the assembly substrate 104 and/or other components electrically coupled to the assembly substrate 104.

The package 102 may include one or more functional devices, such as one or more logic devices 122, one or more memory devices 124, and/or a vertically-stacked combination memory device 130 ("VC memory device 130"). In some embodiments, for example, the package 102 can include a package substrate 112 (e.g., a silicon interposer) and an application processor and/or an HBM along with the VC memory device 130 on the package substrate 112. The functional devices may be placed next to each other (e.g., laterally adjacent to each other) on the package substrate 112. The functional devices can be attached and electrically coupled to the package substrate 112 using solder, wires, fused metal, adhesives, and/or other connecting mechanisms. The package 102 can be a chip-on-wafer (CoW) device and/or the assembly 100 can be a chip-on-wafer-on-substrate (CoWoS) device. Based on the functional devices, the package 102 can be configured to execute a set of functions to process information.

To process the information, the assembly 100 and/or the package 102 may include the VC memory device 130 that has both non-volatile (NV) or persistent memory and volatile or non-persistent memory within or corresponding to one structural unit (e.g., a packaging structure, a housing, and/or a single or combined interface). As described in detail below, the VC memory device 130 can include one or more NV memory dies and one or more DRAM dies vertically stacked on top of each other. The VC memory device 130 may also include a controller die with the vertically stacked NV memory and DRAM dies.

In some embodiments, the package 102 may include an encapsulant (e.g., epoxy or resin material) that directly contacts and encapsulates the VC memory device 130, the logic device 122, the memory device 124, at least a portion of the package substrate 112, or a combination thereof. In some embodiments, the VC memory device 130 may include an encapsulant that encapsulates a set of vertically stacked semiconductor dies.

In some embodiments, the VC memory device 130 can have a height 126 that matches height of other devices on the package substrate 112 and/or other structures on the assembly substrate 104. For example, the VC memory device 130 can be configured to have the height 126 that matches or corresponds to a common height for a set of adjacently-located devices/components.

Figure 2:
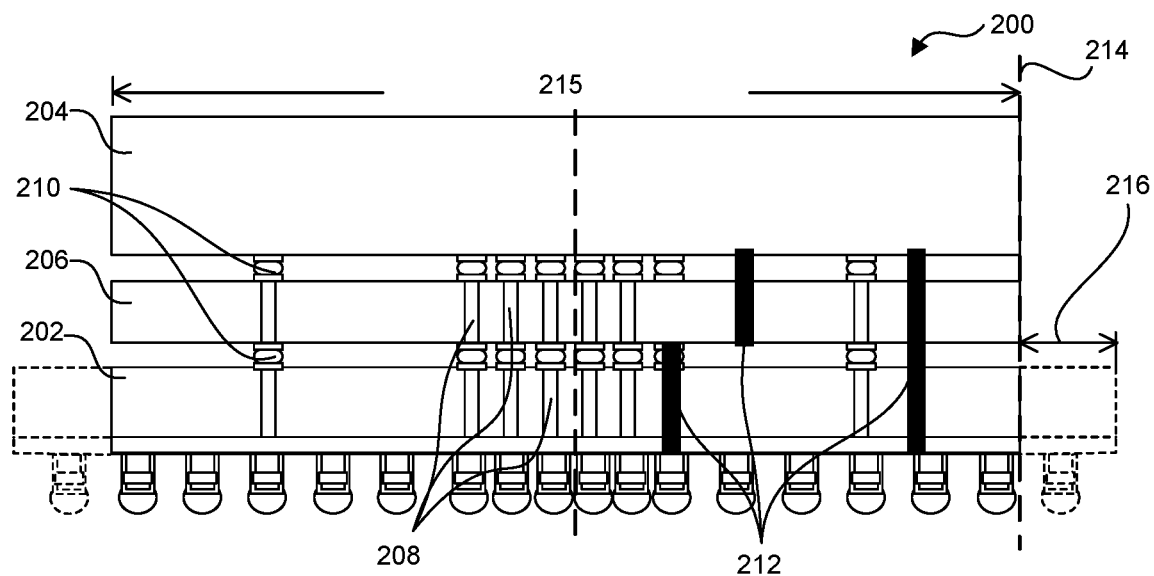
FIG. 2 is a schematic cross-sectional view of a vertically-stacked combination memory device in accordance with embodiments of the technology.

FIG. 2 is a schematic cross-sectional view of a vertically-stacked combination memory device 200 ("VC memory device 200") in accordance with embodiments of the technology. The VC memory device 200 can be an example of the VC memory device 130 of FIG. 1B.

The VC memory device 200 may include a controller die 202, an NV memory die 204, and a volatile memory die 206 within a single structure (e.g., a package). The NV memory die 204 can include NV memory cells (e.g., NAND type floating-gate memory cells that store electric charges) configured to store/retain information (e.g., electrical charges) across power resets/cycles. The volatile memory die 206 (e.g., a DRAM die) can include memory cells that includes capacitors and/or transistors configured to store/retain electric charges while input power is provided or active. The electric charges and the corresponding information stored in the volatile memory die 206 can be removed or changed when the input power is removed. The controller die 202 can include circuits configured to control operations of the NV memory die 204 and/or the volatile memory die 206. For example, the controller die 202 can be configured to control read operations, write operations, erase operations, refresh operations, etc. for the NAND memory and/or the DRAM memory. Also, the controller die 202 can be configured to transfer stored information from one die to another die. In some embodiments, the controller die 202 can be configured to facilitate transfer of information stored in the volatile memory die 206 to the NV memory die 204 based on a triggering event (e.g., a power-off event). The controller die 202 can further restore the previously-stored information to the volatile memory die 206, such as by loading the information stored in the NV memory die 204 to the volatile memory die 206, based on a reloading event (e.g., a power-on event).

In one or more embodiments, the volatile memory die 206 can be directly attached to and over the controller die 202 via attachment mechanisms 210, such as solder, bond wire, and/or adhesive. The volatile memory die 206 can be directly attached to the controller die 202 such that no intervening dies or electrical circuits are between the directly attached structures. Similarly, the NV memory die 204 can be directly attached to and over the volatile memory die 206. Accordingly, the NV memory die 204 can be attached over the controller die 202 with the volatile memory die 206 between the two structures. Thus, the controller die 202, the NV memory die 204, and/or the volatile memory die 206 may form a die stack. In other embodiments, the stacking order of the dies can be different. For example, the volatile memory die 206 can be attached over the NV memory die 204. Also, the controller die 202 can be attached over the volatile memory die 206 and/or the NV memory die 204.

For communicating signals (e.g., commands and/or data) between the vertically attached dies, the controller die 202, the volatile memory die 206, and/or the NV memory die 204 may include through-silicon-vias 208 ("TSVs 208"). The TSVs 208 can include metallic structures (e.g., connective paths) that extend through a body/thickness of the corresponding dies, such as from active sides of the dies to opposing sides thereof. The TSVs 208 may be electrically connected (via, e.g., traces, pads, solder, metal columns, etc.) to provide direct inter-die connections 212 between the attached dies. For example, the direct inter-die connections 212 may allow the controller die 202 to directly communicate (e.g., without routing signals through active circuitry on intervening dies) with the volatile memory die 206 and/or the NV memory die 204.

In some embodiments, the direct inter-die connections 212 may allow an external device (e.g., the logic device 122 of FIG. 1B) to directly communicate with the volatile memory die 206 and/or the NV memory die 204. Additionally or alternatively, the controller die 202 can be configured to provide external interfacing functions for the volatile memory die 206 and/or the NV memory die 204. In other words, the controller die 202 can communicate with the logic device 122 to store information to and/or access information stored in the volatile memory die 206 and/or the NV memory die 204.

For the example illustrated in FIG. 2, the controller die 202 and the volatile memory die 206 include the TSVs 208. The controller die 202 may be a flip chip with the active surface/circuits facing down. The TSVs 208 can thus form the direct inter-die connections 212 between the active side of the controller die 202 and the volatile memory die 206 and/or the NV memory die 204. In some embodiments, the TSVs 208 may provide electrical connections that bypass the active circuitry of the controller die 202 and connect the volatile memory die 206 and/or the NV memory die 204 to the logic device 122 through the package substrate 112 of FIG. 1B.

In some embodiments, the vertically stacked dies may be aligned and/or have one or more matching dimensions. For example, the stacked dies (e.g., the volatile memory die 206, the NV memory die 204, and/or the controller die 202) can have lateral dimensions 215 (e.g., lengths and/or widths) that are the same. The vertically stacked dies may be aligned such that central portions thereof coincide with a vertical alignment line. Also, the vertically stacked dies may have peripheral edges that coincide with a vertical alignment plane 214. Accordingly, the die stack may have a rectangular box shape or a cube shape (i.e., a three-dimensional rectilinear shape). In one or more embodiments, one of the dies (e.g., a bottom die, such as the controller die 202) may have one or more dimensions greater than the lateral dimensions 215 of the other stacked dies. Accordingly, a peripheral edge of the one of the dies may laterally protrude beyond (e.g., located further away from a central portion thereof) corresponding peripheral edges of the stacked dies (e.g., the volatile memory die 206 and/or the NV memory die 204) by a protrusion distance 216.

While solder and/or other adhesive mechanisms physically attach the dies, the operations of the vertically stacked combination of the volatile memory die 206 and the NV memory die 204 may be implemented using the direct inter-die connections 212 and/or the controller die 202. Data, commands, and/or other signals from external devices (e.g., a processor, such as the logic device 122) may be initially processed by the controller die 202. The controller die 202 can use the direct inter-die connections 212 to directly control or operate each of the volatile memory die 206 and the NV memory die 204. For example, the controller die 202 can identify and send crucial data and/or corresponding commands directly to the NV memory die 204 for storage. Also, the controller die 202 may identify a power-off condition, and in response, obtain data stored in the volatile memory die 206 through the corresponding direct inter-die connection(s) 212. Using a separate set of the direct inter-die connection(s) 212, the controller die 202 can store the obtained data in the NV memory die 204 for persistent storage. Upon identifying power restoration, the controller die 202 may obtain the data stored in the NV memory die 204 and restore it to the volatile memory die 206 through the corresponding direct inter-die connection(s) 212.

The VC memory device described above reduces footprint and increases density by vertically stacking volatile and NV memory dies. Also, stacking the volatile and NV memory dies reduces connection distances in comparison to laterally placed/coplanar arrangement of the dies on a common substrate. Accordingly, propagation delays, power loss, and signal degradation for corresponding signals can be reduced, thereby increasing the processing speed and accuracy.

Further, the package 102 including the VC memory device can allow applications (via the logic device 122) to store select/critical data in the NV memory. Moreover, the package 102 can transfer data from the volatile memory to NV memory upon power removal/failure and restore the data to the volatile memory once power is restored, thereby improving data processing efficiency and robustness for the package 102.

Figure 3:
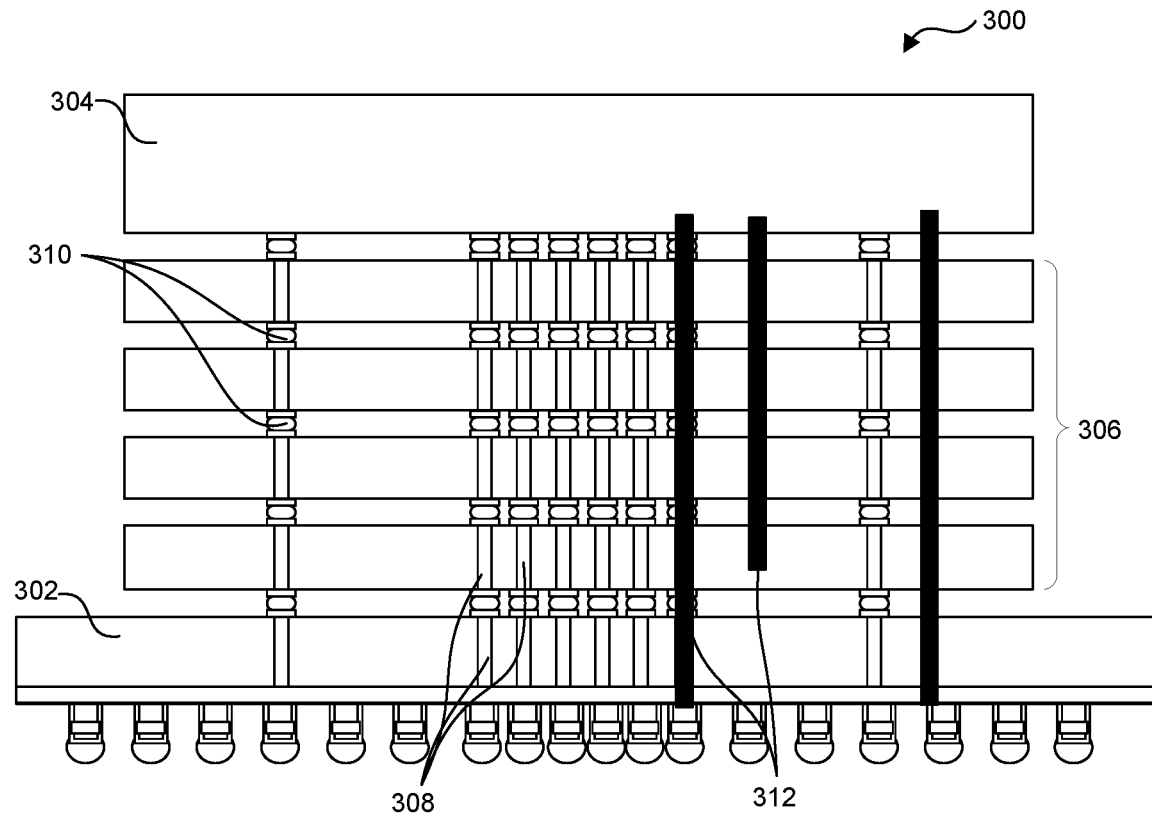
FIG. 3 is a schematic cross-sectional view of a vertically-stacked combination memory device in accordance with embodiments of the technology.

FIG. 3 is a schematic cross-sectional view of a vertically-stacked combination memory device 300 ("VC memory device 300") in accordance with embodiments of the technology. The VC memory device 300 can be an example of the VC memory device 130 of FIG. 1B. The VC memory device 300 can be similar to the VC memory device 200 of FIG. 2.

The VC memory device 300 can include a controller die 302, an NV memory die 304, and a plurality of volatile memory dies 306 within a single structure (e.g., a package). The NV memory die 304 can be similar to the NV memory die 204 of FIG. 2 and include NV memory cells configured to store/retain information across power resets/cycles. Each of the volatile memory dies 306 can be similar to the volatile memory die 206 of FIG. 2 and include non-persistent memory cells configured to store/retain electric charges while input power is provided or active. The controller die 302 can be similar to the controller die 202 of FIG. 2 and include circuits configured to control operations (e.g., read, write, memory transfer, etc.) of the NV memory die 304 and/or the volatile memory dies 306. For example, the controller die 302 can be configured to facilitate/control transfer of information stored in the volatile memory dies 306 to the NV memory die 304 based on a triggering event (e.g., a power-off event). The controller die 302 can further restore the previously-stored information to the volatile memory dies 306, such as by loading the information stored in the NV memory die 304 to the volatile memory dies 306, based on a reloading event (e.g., a power-on event).

In one or more embodiments, the volatile memory dies 306 can be directly attached to and over each other via attachment mechanisms 310 such as solder, connectors, bond wires, and/or adhesive. Similarly, the volatile memory dies 306 (e.g., a bottom die thereof) can be directly attached to and over the controller die 302. Also, the NV memory die 304 can be directly attached to and over the volatile memory dies 306. Accordingly, the NV memory die 304 can be attached over the controller die 302 with the volatile memory dies 306 between the two structures. Thus, the controller die 302, the NV memory die 304, and/or the volatile memory dies 306 may form a die stack. In other embodiments, the stacking order of the dies can be different. For example, the volatile memory dies 306 can be attached over the NV memory die 304. Also, the controller die 302 can be attached over the volatile memory dies 306 and/or the NV memory die 304.

Signals (e.g., commands and/or data) can be transferred between the vertically attached dies (e.g., the controller die 302, the volatile memory dies 306, and/or the NV memory die 304) by through-silicon-vias 308 ("TSVs 308"). The TSVs 308 may be electrically connected (via, e.g., traces, pads, solder, metal columns, etc.) to provide direct inter-die connections 312 between the attached dies. For example, the direct inter-die connections 312, similar to the direct inter-die connections 212 of FIG. 2, may allow the controller die 302 to directly communicate with one or more of the volatile memory dies 306 and/or the NV memory die 304. Similar to the direct inter-die connections 212, the direct inter-die connections 312 may allow an external device (e.g., the logic device 122 of FIG. 1B) to directly communicate with one or more of the volatile memory dies 306 and/or the NV memory die 304. Additionally or alternatively, the controller die 302 can be configured to provide external interfacing functions for the volatile memory dies 306 and/or the NV memory die 304.

Similar to the VC memory device 200, the VC memory device 300 can include vertically stacked dies that are aligned and/or have one or more matching dimensions. For example, the volatile memory dies 306, the NV memory die 304, and/or the controller die 202 can have one or more common lateral dimensions. Also, the volatile memory dies 306, the NV memory die 304, and/or the controller die 302 can be aligned such that center portions thereof are coincident with a common center line and/or such that peripheral edges thereof are coincident with a vertical plane. In one or more embodiments, one of the dies (e.g., a bottom die, such as the controller die 302) may have one or more dimensions greater than those of the other stacked dies such that a peripheral portion of the one of the dies laterally protrudes beyond corresponding peripheral edges of the stacked dies.

The plurality of the volatile memory dies 306 provide increased storage capacity for the VC memory device 300. With the increase in the number of the volatile memory dies 306, the VC memory device 300 may provide increased non-persistent storage capacity (e.g., DRAM capacity) without increasing the overall footprint. Moreover, the vertically stacked NV memory die 304 and the controller die 302 can enable combined operations for the VC memory device 300 similar to the VC memory device 200 described above.

Figure 4:
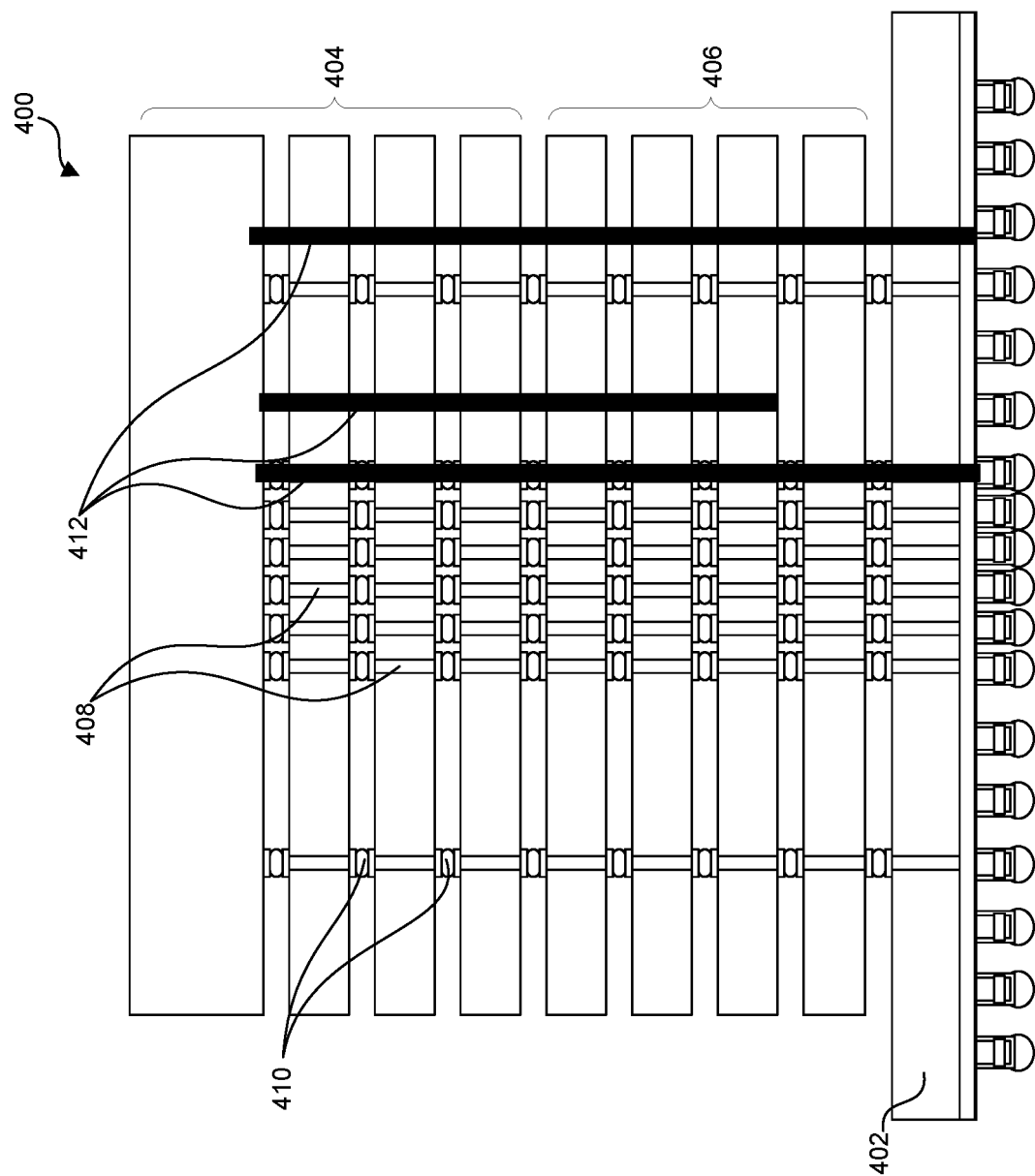
FIG. 4 is a schematic cross-sectional view of a vertically-stacked combination memory device in accordance with embodiments of the technology.

FIG. 4 is a schematic cross-sectional view of a vertically-stacked combination memory device 400 ("VC memory device 400") in accordance with embodiments of the technology. The VC memory device 400 can be an example of the VC memory device 130 of FIG. 1B. The VC memory device 400 can be similar to the VC memory device 200 of FIG. 2 and/or the VC memory device 300 of FIG. 3.

The VC memory device 400 can include a controller die 402, a plurality of NV memory dies 404, and a plurality of volatile memory dies 406 within a single structure (e.g., a package). Each of the NV memory dies 404 can be similar to the NV memory die 204 of FIG. 2 and include NV memory cells configured to store/retain information across power resets/cycles. Each of the volatile memory dies 406 can be similar to the volatile memory die 206 of FIG. 2 and include non-persistent memory cells configured to store/retain electric charges while input power is provided or active. The controller die 402 can be similar to the controller die 202 of FIG. 2 and include circuits configured to control operations (e.g., read, write, memory transfer, etc.) of the NV memory dies 404 and/or the volatile memory dies 406. For example, the controller die 402 can be configured to facilitate/control transfer of information stored in the volatile memory dies 406 to the NV memory dies 404 based on a triggering event (e.g., a power-off event). The controller die 402 can further restore the previously-stored information to the volatile memory dies 406, such as by loading the information stored in the NV memory dies 404 to the volatile memory dies 406, based on a reloading event (e.g., a power-on event).

In one or more embodiments, the volatile memory dies 406 can be directly attached to and over each other via attachment mechanisms 410 such as solder, connectors, bond wires, and/or adhesive. Similarly, the NV memory dies 404 can be directly attached and over each other. Also, the volatile memory dies 406 (e.g., a bottom die thereof) can be directly attached to and over the controller die 402. Also, the NV memory dies 404 can be directly attached to and over the volatile memory die 406. Accordingly, the NV memory dies 404 can be attached over the controller die 402 with the volatile memory dies 406 between the two structures. Thus, the controller die 402, the NV memory dies 404, and/or the volatile memory dies 406 may form a die stack. In other embodiments, the stacking order of the dies can be different. For example, the volatile memory dies 406 can be attached over the NV memory dies 404. Also, the controller die 402 can be attached over the volatile memory dies 406 and/or the NV memory dies 404.

Signals (e.g., commands and/or data) can be communicated between the vertically attached dies (e.g., the controller die 402, the volatile memory dies 406, and/or the NV memory dies 404) by through-silicon-vias 408 ("TSVs 408"). The TSVs 408 may be electrically connected (via, e.g., traces, pads, solder, metal columns, etc.) to provide direct inter-die connections 412 between the attached dies. For example, the direct inter-die connections 412, similar to the direct inter-die connections 212 of FIG. 2, may allow the controller die 402 to directly communicate with one or more of the volatile memory dies 406 and/or one or more of the NV memory dies 404. Similar to the direct inter-die connections 212, the direct inter-die connections 412 may allow an external device (e.g., the logic device 122 of FIG. 1B) to directly communicate with one or more of the volatile memory dies 406 and/or one or more of the NV memory dies 404. Additionally or alternatively, the controller die 402 can be configured to provide external interfacing functions for the volatile memory dies 406 and/or the NV memory dies 404.

Similar to the VC memory device 200, the VC memory device 400 can include the vertically stacked dies that are aligned and/or have one or more matching dimensions. For example, the volatile memory dies 406, the NV memory dies 404, and/or the controller die 402 can have one or more common lateral dimensions. Also, the volatile memory dies 406, the NV memory dies 404, and/or the controller die 202 can be aligned such that center portions thereof are coincident with a vertical line and/or such that peripheral edges thereof are coincident with a vertical plane. In one or more embodiments, one of the dies (e.g., a bottom die, such as the controller die 402) may have one or more dimensions greater than those of the other stacked dies, such that a peripheral portion of the one of the dies laterally protrudes beyond corresponding peripheral edges of the stacked dies.

The plurality of the volatile memory dies 406 and the plurality of NV memory dies 404 provide increased storage capacity for the VC memory device 400. With the increase in the number of both types of dies, the VC memory device 400 may provide increased persistent and non-persistent storage capacity without increasing the overall footprint. Moreover, the vertically stacked NV memory dies 404 and the controller die 402 can enable combined operations for the VC memory device 300 similar to the VC memory device 200 described above.

Figure 5:
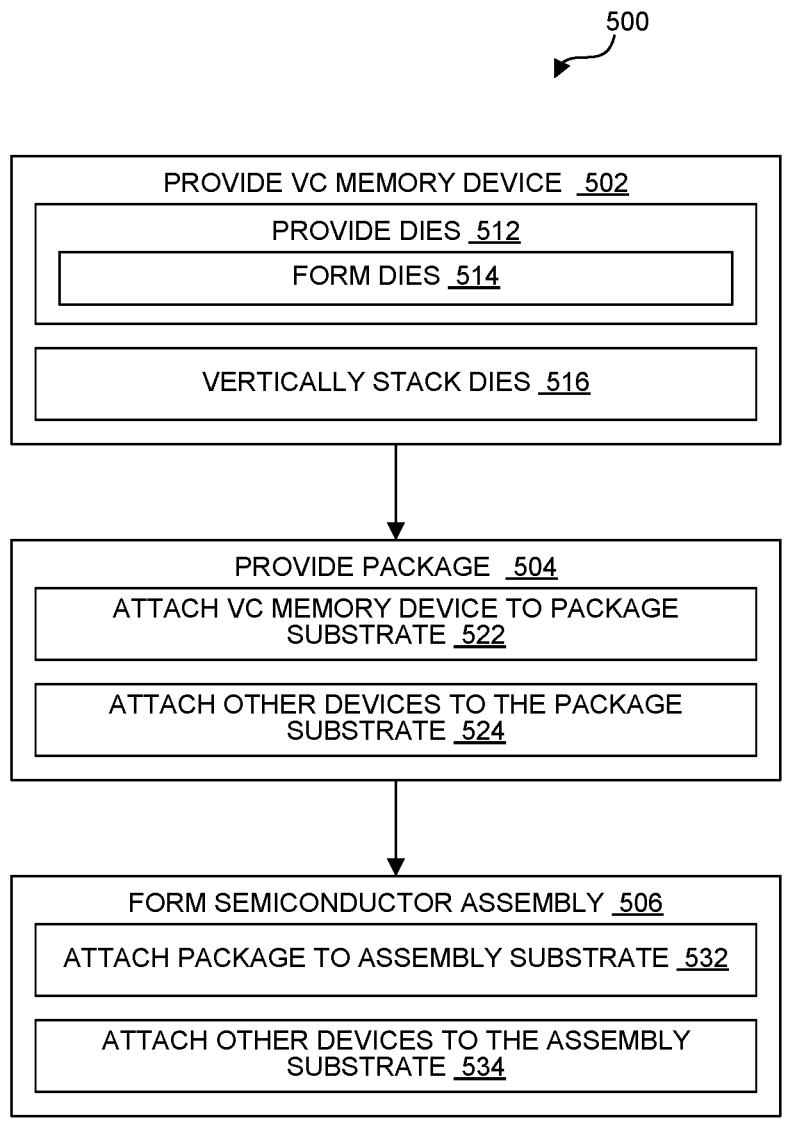
FIG. 5 is a flow chart illustrating a method of manufacturing a semiconductor device assembly in accordance with embodiments of the technology.

FIG. 5 is a flow chart illustrating a method 500 of manufacturing a semiconductor device (e.g., the VC memory device 200 of FIG. 2, the VC memory device 300 of FIG. 3, the VC memory device 400 of FIG. 4, the package 102 of FIG. 1A, and/or the assembly 100 of FIG. 1A) in accordance with embodiments of the technology. The method 500 can be for manufacturing the semiconductor device including the VC memory device that includes a die stack that includes at least one NV memory die and at least one volatile memory die.

At block 502, the method includes providing VC memory device (e.g., the VC memory device 200, the VC memory device 300, and/or the VC memory device 400). For example, a die stack that includes at least one volatile memory die (e.g., DRAM die) and at least one NV memory die (e.g., NAND die) physically and operationally coupled together in a vertical-stack configuration may be provided.

In some embodiments, providing the VC memory device may include assembling or forming the VC memory device. At block 512, dies may be provided for the assembly. For example, the controller die 202 of FIG. 2, the controller die 302 of FIG. 3, the controller die 402 of FIG. 4, the volatile memory die 206 of FIG. 2, the volatile memory dies 306 of FIG. 3, the volatile memory dies 406 of FIG. 4, the NV memory die 204 of FIG. 2, the NV memory die 304 of FIG. 3, and/or the NV memory dies 404 of FIG. 4 may be provided. The provided dies can include active circuitry (e.g., semiconductor devices on an active side) and/or connections between active circuitry. The provided dies may also have inter-die connectors, such as pillars, pads, solder bumps, and/or TSVs (e.g., the TSVs 208 of FIG. 2, the TSVs 308 of FIG. 3, and/or the TSVs 408 of FIG. 4).

In one or more embodiments, providing the dies may include forming or fabricating the dies. At block 514, the dies may be formed. For example, the dies may be formed via processes such as masking, doping, etching, depositing, thinning, bonding, etc., that form the active circuitry and the connections (e.g., traces) for each of the dies. Also, forming the dies may include processes that remove certain portions of silicon substrate, deposit metallic and/or dielectric materials into the resulting recess (e.g., vias), and/or connect the metal features in the recess to other connections to form the TSVs within the dies.

At block 516, the provided dies may be vertically stacked for assembling or forming the VC memory device. For example, a bottom die (e.g., the controller die) may be provided. A first set of dies (e.g., including at least one volatile memory die) may be attached over the bottom die. A second set of dies (e.g., including at least one NV memory die) may be attached over the bottom die and/or the first set of dies. For the examples illustrated in FIGS. 2-4, a volatile memory die may be directly attached to and over the controller die. Also, a NV memory die may be directly attached to and over a volatile memory die, which may be the same die that is directly attached to the controller die or a different volatile memory die.

The dies may be attached using electrical and/or mechanical mechanisms. For example, the dies may be attached by reflowing and hardening solder, fusing metallic structures (e.g., pillars), connecting bond wires, and/or connecting other electro-mechanical structures. Also, the dies may be attached via adhesives and/or encapsulants provided between the attached dies. In attaching the dies, the dies may be positioned so that the TSVs are electrically coupled to one or more vertically adjacent dies. For example, the TSVs in one die can contact vertical connectors (e.g., pads, pillars, solder, etc.) that are on or electrically connected to the die above and/or the one die.

Vertically stacking the dies may include aligning center portions and/or peripheral portions of the die before attaching the dies. For example, the controller die, the volatile memory die, and/or the NV memory die may be positioned to have center portions thereof coincident with a common center line. In other words, the dies may be placed at different heights and with the center portions at the same lateral location overlapping each other. Also, the controller die, the volatile memory die, and/or the NV memory die may be positioned to have one or more peripheral edges thereof coincident with corresponding vertically-oriented planes. Accordingly, the dies may be stacked to form a rectangular box or a cubic shape.

At block 504, the method can include providing a package (e.g., the package 102 of FIG. 1A). The provided package can include the VC memory device (e.g., the VC memory device 200, the VC memory device 300, and/or the VC memory device 400). In some embodiments, providing the package may include assembling or forming the package. At block 522, the provided VC memory device may be attached to a package substrate (e.g., the package substrate 112 of FIG. 1B, such as a silicon interposer). The VC memory device may be attached similarly as described above for the dies. For example, a bottom die in the VC memory device (e.g., the controller die) may be attached to the package substrate through solder, fused metal, adhesive, wires, etc.

At block 524, other devices may be attached to the package substrate. For example, the logic device 122 of FIG. 1B and/or the memory device 124 of FIG. 1B may be attached to the package substrate. The other devices may be attached to a common surface as the VC memory device such that the other devices and the VC memory device are laterally adjacent to each other.

In some embodiments, the VC memory device, the other devices, and/or the package substrate may be encapsulated to form the package. In some embodiments, the VC memory device may be separately encapsulated (e.g., as part of forming the VC memory device).

At block 506, the method can include forming a semiconductor assembly (e.g., the assembly 100 of FIG. 1). For example, an assembly substrate (e.g., the assembly substrate 104 of FIG. 1A) may be provided. At block 532, the provided package may be attached to the assembly substrate. At block 534, other components/devices may be attached to the assembly substrate to form the semiconductor assembly.

Figure 6:
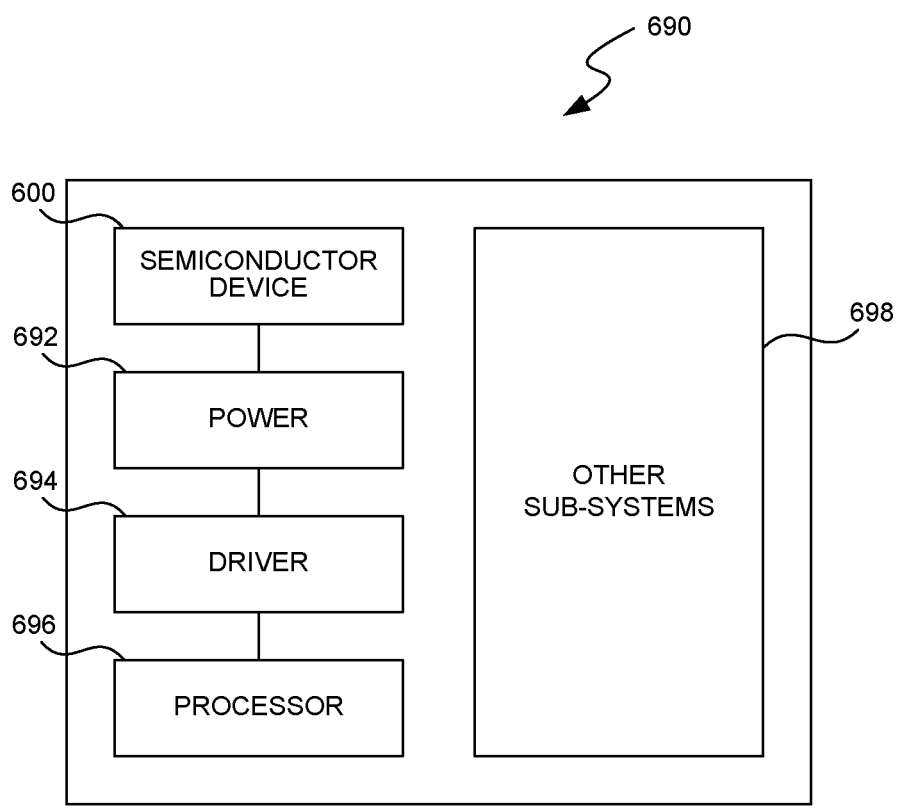
FIG. 6 is a schematic view of a system that includes a semiconductor assembly configured in accordance with embodiments of the present technology.

Any one of the semiconductor devices described above with reference to FIGS. 1A-5 can be incorporated into any of a myriad of larger and/or more complex systems, a representative example of which is system 690 shown schematically in FIG. 6. The system 690 can include a semiconductor device 600 ("device 600") (e.g., a semiconductor device, package, and/or assembly), a power source 692, a driver 694, a processor 696, and/or other subsystems or components 698. The device 600 can include features generally similar to those devices described above. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, and appliances. Components of the system 690 may be housed in a single unit or distributed over multiple, interconnected units (e.g., through a communications network). The components of the system 690 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. A semiconductor package, comprising:
a die stack, the die stack including:
   at least one volatile memory die;
   at least one non-volatile (NV) memory die including a NV memory die; and
   a controller device attached to the die stack, the controller device configured to provide an interface between the die stack and an external processor,
   wherein the at least one volatile memory die includes a volatile memory die with through-silicon-vias (TSVs) coupled to the controller device and coupled to the NV memory die.

2. The semiconductor package of claim 1, wherein:
the NV memory die is attached above the volatile memory die.

3. The semiconductor package of claim 2, wherein:
the controller device comprises a controller die; and
the volatile memory die is attached above the controller die.

4. The semiconductor package of claim 3, wherein the TSVs comprise inter-die connections at least between the controller die and the NV die.

5. The semiconductor package of claim 3, wherein:
the die stack and the controller die have center portions that are aligned; and
the controller die protrudes beyond an edge of the die stack.

6. The semiconductor package of claim 3, wherein:
the die stack has a length;
the controller die has the length; and
the die stack and the controller die have edges that are aligned.

7. The semiconductor package of claim 1, wherein:
the at least one volatile memory die and the at least one NV memory die each have a common length between an edge and an opposing edge; and
the at least one volatile memory die and the at least one NV memory die are aligned with edges thereof coincident with a plane.

8. The semiconductor package of claim 1, wherein the controller device is configured to transfer data between the at least one volatile memory die and the at least one NV memory die.

9. The semiconductor package of claim 1, wherein the at least one volatile memory die comprises a high bandwidth memory (HBM) device that includes two or more dynamic random-access memory (DRAM) dies.

10. The semiconductor package of claim 1, wherein the at least one NV memory die comprises at least one NAND memory die.

11. A semiconductor package, comprising:
a substrate;
a logic device attached to the substrate; and
a vertical combination (VC) memory device attached to the substrate, wherein the VC memory device includes—
   at least one dynamic random-access memory (DRAM) die,
   at least one non-volatile (NV) memory die, and
   a controller die coupled to the substrate, the at least one DRAM die, and the at least one NV memory die, the controller die configured to provide an interface for the VC memory device and to control the VC memory device,
   wherein the at least one DRAM die, the at least one NV memory die, and the controller die are stacked on top of each other.

12. The semiconductor package of claim 11, wherein:
the at least one DRAM die comprises a high bandwidth memory (HBM) device that includes a plurality of DRAM dies attached above the controller die; and
the least one NV memory die includes at least one NAND memory die attached above the HBM device.

13. The semiconductor package of claim 11, wherein the logic device comprises an application processor.

14. The semiconductor package of claim 11, wherein the semiconductor package comprises a Chip-on-Wafer (CoW) package device.

15. A semiconductor assembly, comprising:
a stacked combination (SC) memory device coupled to an assembly substrate, wherein the SC memory device includes—
   at least one dynamic random-access memory (DRAM) die,
   at least one non-volatile (NV) memory die, and
   a controller die coupled to the assembly substrate, the at least one DRAM die, and the at least one NV memory die, the controller die configured to provide an interface for the SC memory device,
   wherein the at least one DRAM die, the at least one NV memory die, and the controller die are stacked on top of each other.

16. The semiconductor assembly of claim 15, wherein the SC memory device comprises a semiconductor package attached to the assembly substrate, the semiconductor package including:
a package substrate attached to the SC memory device; and
a logic device attached to the package substrate and to the SC memory device.

17. The semiconductor assembly of claim 16, wherein the semiconductor package comprises a chip-on-wafer (CoW) device.

18. The semiconductor assembly of claim 16, wherein the logic device comprises an external processor.

19. The semiconductor assembly of claim 18, wherein:
the package substrate comprises a silicon interposer; and
the assembly substrate comprises a printed circuit board (PCB).

20. The semiconductor assembly of claim 18, wherein the semiconductor assembly comprises a chip-on-wafer-on-substrate (CoWoS) device.

\* \* \* \* \*